(12) United States Patent
Wang

(10) Patent No.: US 6,715,286 B1
(45) Date of Patent: Apr. 6, 2004

(54) RADIATION APPARATUS

(75) Inventor: Frank Wang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/331,988

(22) Filed: Dec. 31, 2002

(51) Int. Cl.⁷ .............................................. F01B 29/10
(52) U.S. Cl. ........................................ 60/527; 60/528
(58) Field of Search .......................... 60/527, 528, 529

(56) References Cited

U.S. PATENT DOCUMENTS

| | | | | |
|---|---|---|---|---|
| 4,348,624 A | * | 9/1982 | Anderson et al. ........... 318/634 |
| 4,553,393 A | * | 11/1985 | Ruoff ........................... 60/528 |
| 6,516,146 B1 | * | 2/2003 | Kosaka ........................ 396/55 |
| 6,591,616 B2 | * | 7/2003 | Ovshinsky et al. .......... 62/46.2 |

\* cited by examiner

*Primary Examiner*—Hoang Nguyen
(74) *Attorney, Agent, or Firm*—Birch, Stewart, Kolasch & Birch, LLP

(57) ABSTRACT

A radiation apparatus is disclosed. The radiation apparatus completely adheres to a central processing unit for absorbing thermal energy generated by the central processing unit. When disassociating the radiation apparatus from the central processing unit, the radiation apparatus presses the central processing unit by a disassociating flake. Thus the radiation apparatus moves for disassociating from the central processing unit, to achieve the purpose of completely disassociating the radiation apparatus from the central processing unit.

16 Claims, 6 Drawing Sheets

RADIATION APPARATUS

BACKGROUND OF THE INVENTION

1. Field of Invention

The invention relates to a radiation apparatus for absorbing thermal energy generated by the central processing unit of a computer, and particularly to a radiation apparatus completely disassociated from the central processing unit when the absorbing member of the radiation apparatus completely adheres to the central processing unit.

2. Related Art

As electronic devices are used, the elements of the electronic devices usually generate a lot of thermal energy. A radiation apparatus is needed to absorb the thermal energy of the electronic devices and to avoid too much thermal energy gathering in the elements and damaging them. Central processing units nowadays generate more thermal energy than before because the operation capability of the central processing unit is getting improving to satisfy the demand of processing data at high speed. Thus, using a radiation apparatus to absorb thermal energy generated by the central processing unit is a must today.

Generally speaking, the common method of absorbing thermal energy generated by the central processing unit is to mount the absorbing member directly on the central processing unit, or to mount fans near the central processing unit. Adhesive is used between the absorbing member and the central processing unit for completely adhering, in order to enhance the absorption of thermal energy. When the radiation apparatus is damaged, it is hard to disassociate the absorbing member of the radiation apparatus from the central processing unit owing to the adhesive. So when disassociating the absorbing member of the radiation apparatus from the central processing unit, the absorbing member and the central processing unit may disassociate from the printed circuit board together. Thus, when disassociating the radiation apparatus from the central processing unit, the central processing unit may be damaged, or the disassociating action cannot be performed when the central processing unit is running.

In view of the aforesaid disadvantages, it is necessary to develop a radiation apparatus to completely disassociate the absorbing member of the radiation apparatus from the central processing unit, and to allow the disassociating action to be performed when the central processing unit is running.

SUMMARY OF THE INVENTION

An objective of the invention is to provide a radiation apparatus for disassociating the absorbing member from the central processing unit when the absorbing member and the central processing unit are completely adhered to each other. Thus the absorbing member and the central processing unit may not disassociate from the printed circuit board together.

The disclosed radiation apparatus has an absorbing member, a fixing member, an elastic member, and a disassociating flake. The absorbing member adheres to the central processing unit. The fixing member, moveably mounted to the absorbing member, has a head at a distance from the absorbing member and a neck with a diameter smaller than the diameter of the head. The elastic member moveably mounts to the neck of the fixing member and the disassociating flake also moveably mounts to the neck of the fixing member. The body of the disassociating flake passes through by the neck of the fixing member, a forcing portion corresponding to the central processing unit mounted on a side of the body with a different angle, and a pulled portion mounted on the other side of the body.

When disassociating the absorbing member completely adhered to the central processing unit from the surface of the central processing unit, the pulled portion is pulled to press the elastic member, and the disassociating flake rotates around the fixing member in the meantime. So the forcing member moves relative to the central processing unit to press the surface of the central processing unit for completely disassociating. Then the elastic member moves the disassociating flake back to its original place by elasticity.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
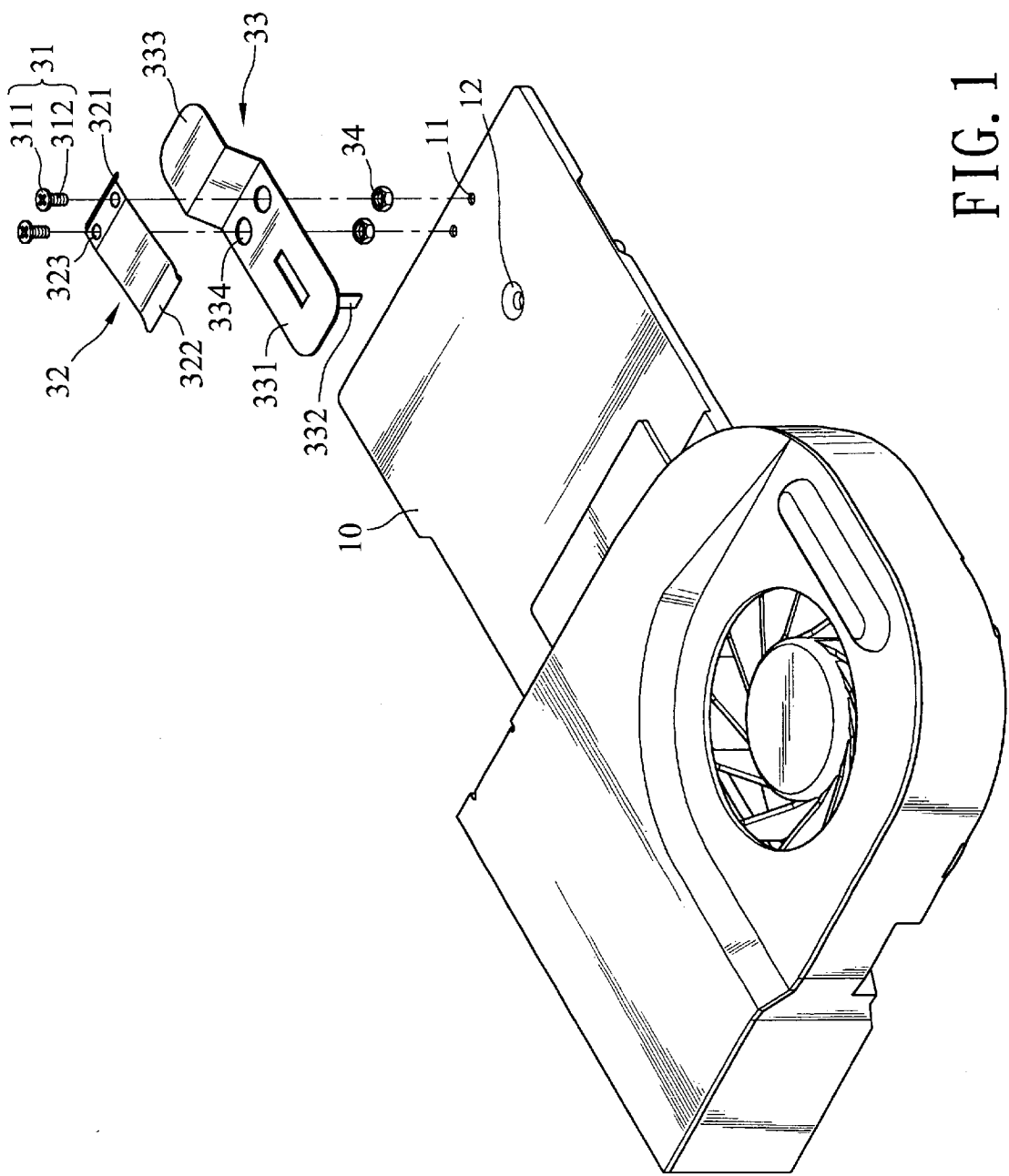
FIG. 1 is an exploded view of the invention.
Figure 2:
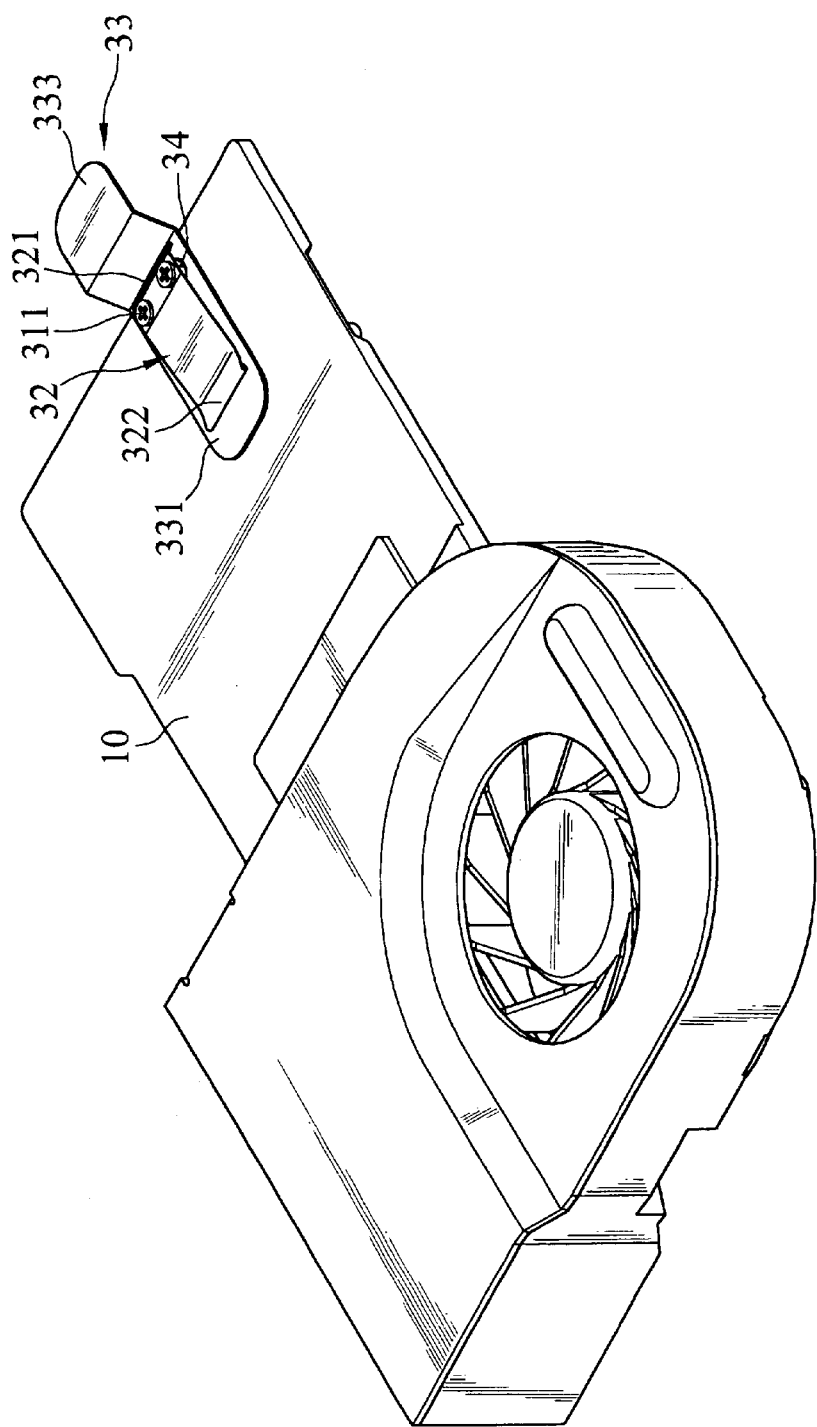
FIG. 2 is a perspective view of the assembled invention.

As shown in FIGS. 1, 2, 3A, 3B and 3C, the absorbing member 10 of the disclosed radiation apparatus can be completely disassociating from the central processing unit 20. Generally speaking, the absorbing member 10 of the radiation apparatus completely adheres to the central processing unit 20 for absorbing thermal energy generated by the central processing unit 20 when running.

The disclosed radiation apparatus has an absorbing member 10, a fixing member 31, an elastic member 32, a disassociating flake 33, and a sleeve 34. The absorbing member 10 completely adheres to the central processing unit 20 having a screw hole 11 and cavity 12. The fixing member 31, which is a screw, moveably mounted to the absorbing member 10 has a head 311 at a distance from the absorbing member 10 and a neck 312 with a diameter smaller than the diameter of the neck 312.

The elastic member 32, which is a leaf spring, moveably mounted to the neck 312 of the fixing member 31, has a pressing end 321, a forcing end 322, and a hole 323 between the pressing end 321 and the forcing end 322. The neck 312 of the fixing member 31 passes through the hole 323 of the elastic member 32.

The disassociating flake 33, moveably mounted on the neck 312 of the fixing member 31, has a body 331, a forcing portion 332, and a pulled portion 333. The body 331 has a hollow 334 for the neck 312 of the fixing member 31 to pass through. The forcing portion 332 mounts on the side of the body 331 forming an angle difference between the body 331 and the forcing portion 332. The forcing portion 332 corresponds to the cavity 12 of the absorbing member 10 passing through the cavity 12 and corresponding to the central processing unit 20 to make contact with the surface of the central processing unit 20. The pulled portion 333 is mounted on the other side of the body 331.

The sleeve 34, moveably mounted to the neck 312 with outer screw thread of the fixing member 31, has an inner screw thread. The sleeve 34 and the head 311 of the fixing member 31 clip the elastic member 32 as the sleeve 34 mounts to the neck 312 of the fixing member 31.

When installing the radiation apparatus, let the neck 312 of the fixing member 31 pass through the hole 323 of the elastic member 32 and the hollow 334 of the body 331. Mounting the sleeve 34 to the neck 312 of the fixing member 31 clips the elastic member 32 with the head 311. Then make sure the fixing member 31 corresponds to the screw 11 of the absorbing member 10 and the forcing portion 332 corresponds to the cavity 12. The installation can be done after the fixing member 31 mounts to the screw 11 of the absorbing member 10.

Figure 3A:
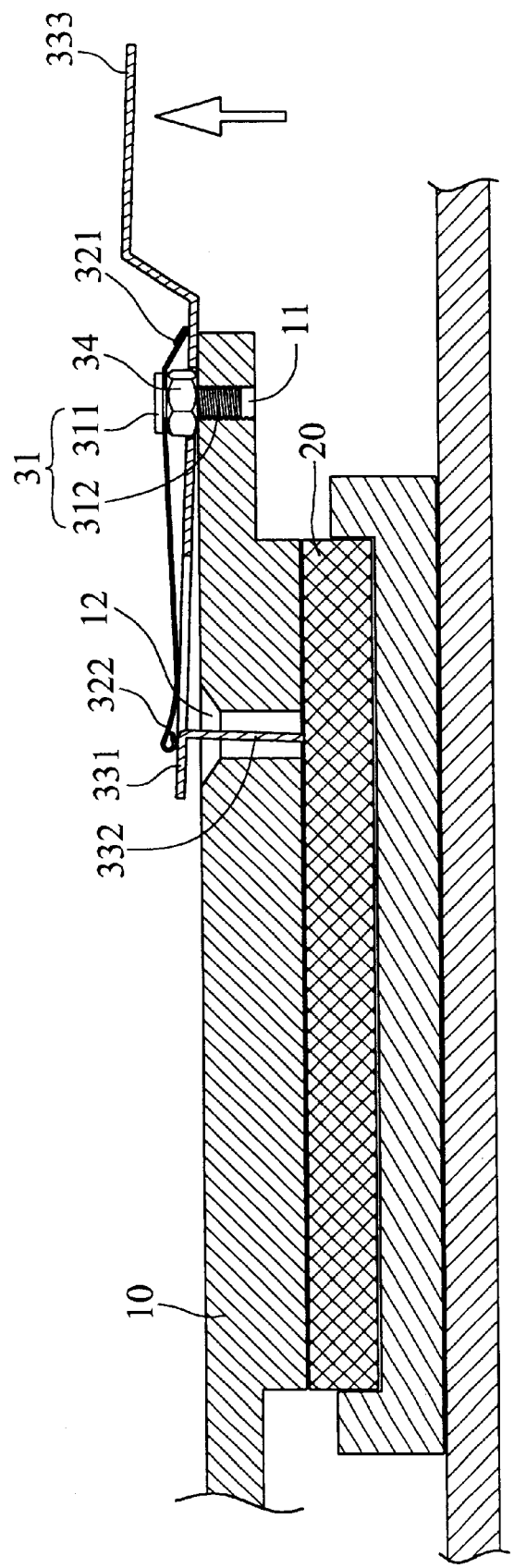
FIGS. 3A, 3B, and 3C are schematic views of the invention in various moving conditions.
Figure 3B:
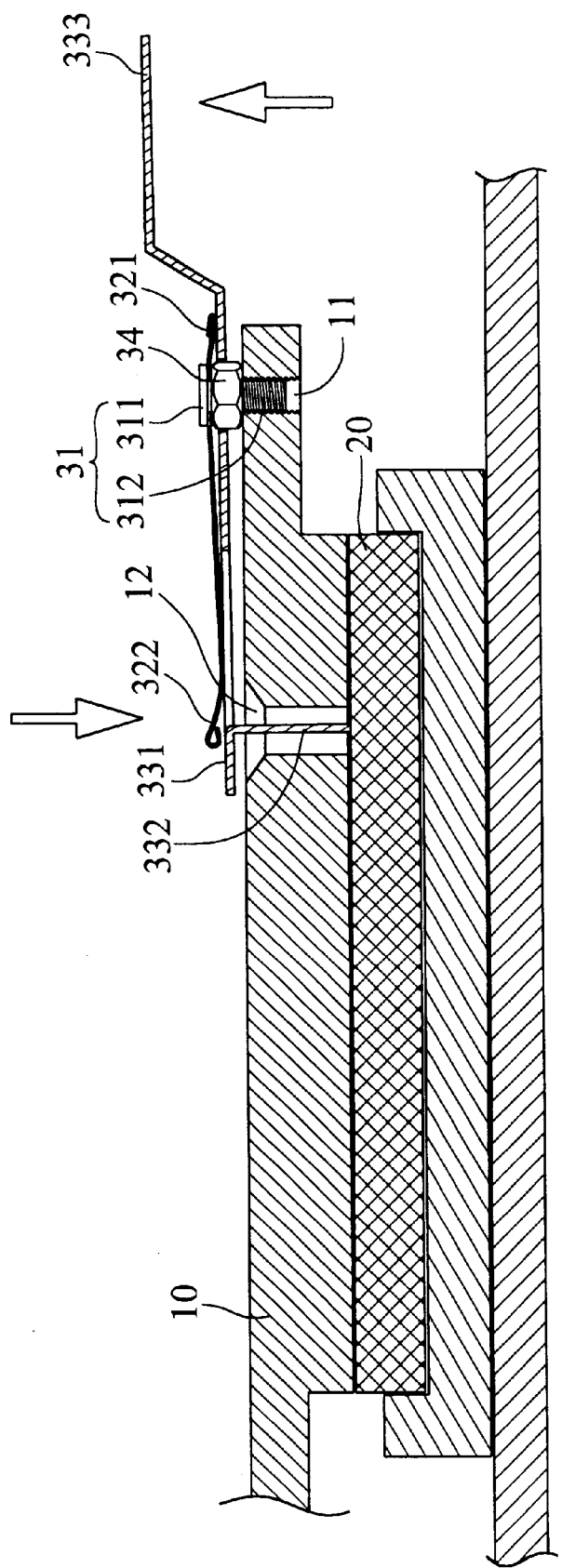
Figure 3C:
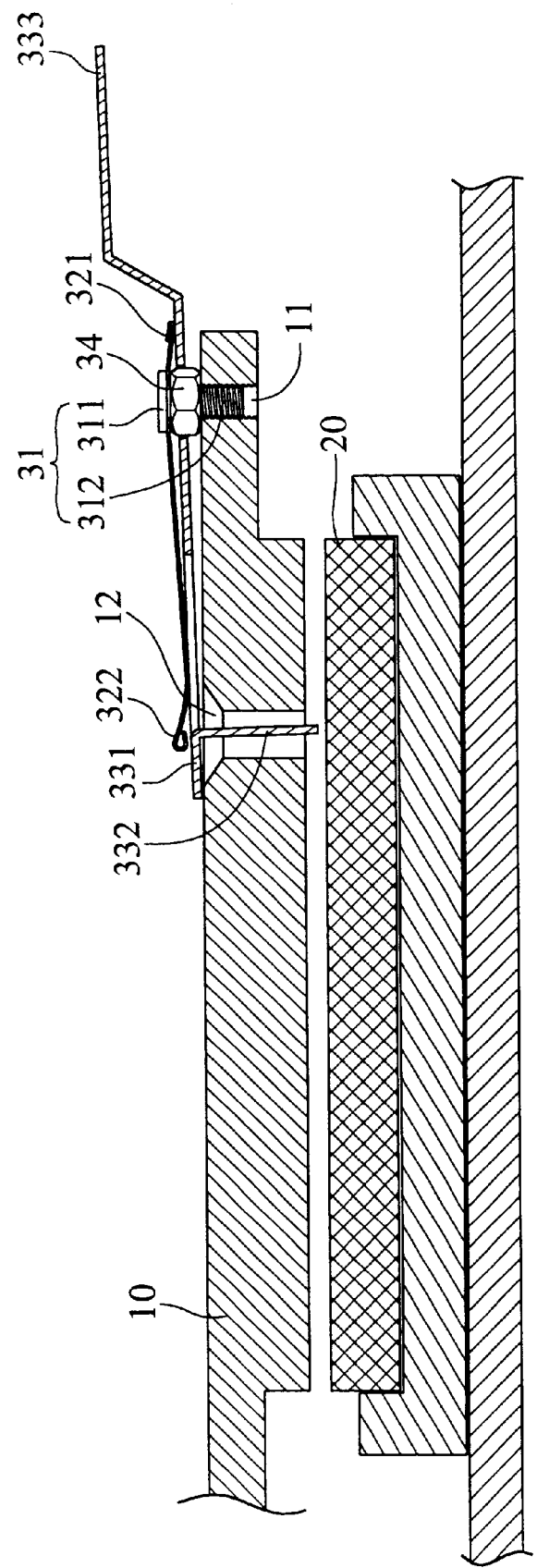

As shown in FIGS. 3A, 3B, and 3C, when disassociating the absorbing member 10, the user can pull the pulled portion 333 with his or her forefinger and press the top of the forcing portion 332 with his or her thumb. As the user pulls the pulled portion 333 with his or her forefinger, the pressing end 321 of the elastic member 32 is pressed, and the pressing end 321 of the elastic member 32 moves with the pulled portion 333. At the same time, the body 331 of the disassociating flake 33 and the elastic member 32 rotate around the fixing member 31 and the forcing end 322 presses the body 331 with the force of the thumb. Thus the forcing portion 332 corresponding to the cavity 12 moves relative to the central processing unit 20 through the cavity 12. The forcing portion 332 presses the surface of the central processing unit 20 for completely disassociating the absorbing member 10 from the central processing unit 20. The elastic member 32 moves the disassociating flake 33 back to its original place by elasticity.

Moreover, the sleeve 34 can be an E-ring for facilitating installation.

Figure 4:
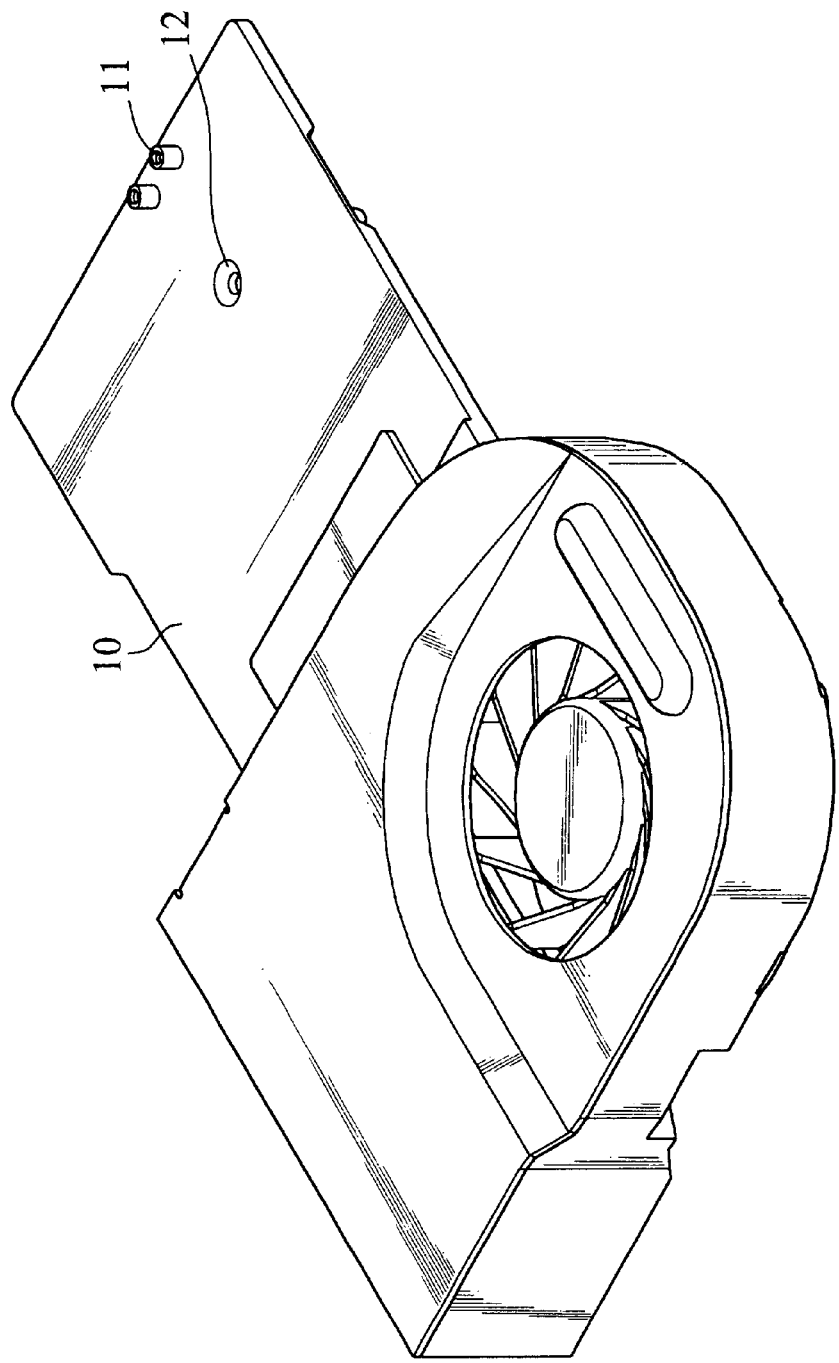
FIG. 4 is a perspective view of another embodiment of the absorbing member.

As shown in FIG. 4, the sleeve 34 is mounted on the absorbing member 10. The user can make the fixing member 31 pass through the hole 323 of the elastic member 32 and the hollow 334 of the disassociating flake 33, and the fixing member 31 can mounted to the absorbing member 10 through the sleeve 34.

Effects of the Invention

The disclosed radiation apparatus can achieve the following effects:

1. The forcing portion presses the central processing unit to completely disassociate the absorbing member from the central processing unit when the absorbing member and the central processing unit are completely adhered to each other. Thus the absorbing member and the central processing unit may not disassociate from the printed circuit board together.

2. The disassociating action can be performed when the central processing unit is running.

What is claimed is:

1. A radiation apparatus, which comprises:
   an absorbing member, completely adhered to a central processing unit for absorbing thermal energy generated by the central processing unit;
   a fixing member, moveably mounted on the absorbing member, comprising a head at a distance from the absorbing member and a neck with a diameter smaller than the diameter of the head;
   an elastic member, moveably mounted to the neck of the fixing member; and
   a disassociating flake, moveably mounted to the neck of the fixing member, comprising a body passed through by the neck of the fixing member, a forcing portion corresponding to the central processing unit mounted on a side of the body with a different angle, and a pulled portion mounted on the other side of the body, when disassociating the absorbing member from the surface of the central processing unit, the pulled portion being pulled to press the elastic member, the disassociating flake rotating around the fixing member in the meanwhile, so the forcing member moving relative to the central processing unit to press the surface of the central processing unit for completely disassociating, then the elastic member moving the disassociating flake back to its original place by elasticity.

2. The radiation apparatus of claim 1, wherein the elastic member, a leaf spring, comprises a pressing end and a forcing end, the neck of the fixing member passing through the elastic member between the pressing end and the forcing end, after the pulled portion being pulled, the pressing end and the pulled portion moving at the same time, the forcing end and the body rotating together, and the forcing end pressing the body for disassociating the absorbing member.

3. The radiation apparatus of claim 2, wherein the elastic member comprises a hole for the neck of the fixing member to pass through.

4. The radiation apparatus of claim 1 further comprises a sleeve moveably mounted to the neck of the fixing member passing through the disassociating flake, and the sleeve and the head of the fixing member clipping the elastic member.

5. The radiation apparatus of claim 4, wherein the sleeve is fixed mounted on the radiation apparatus.

6. The radiation apparatus of claim 4, wherein the absorbing member comprises a screw hole, the neck of the fixing member comprising an outer screw thread, the sleeve comprising an inner screw thread corresponding to the outer screw thread for combining the fixing member and the sleeve and mounting the fixing member and the sleeve on the absorbing member.

7. The radiation apparatus of claim 1, wherein the disassociating flake further comprises a hollow for the neck of the fixing member to pass through.

8. The radiation apparatus of claim 1, wherein the absorbing member further comprises a cavity corresponding to the forcing portion for the forcing portion to pass through and for the forcing portion to contact the surface of the central processing unit.

9. The radiation apparatus of claim 1, wherein the fixing member is a screw.

10. A mechanism for disassociating radiation apparatus, mounted on a radiation apparatus comprising an absorbing member completely adhering to a central processing unit, the mechanism comprises:
   a fixing member, moveably mounted on the absorbing member, comprising a head at a distance from the absorbing member and a neck with a diameter smaller than the diameter of the head;
   an elastic member, moveably mounted to the neck of the fixing member; and
   a disassociating flake, moveably mounted to the neck of the fixing member, comprising a body passed through by the neck of the fixing member, a forcing portion corresponding to the central processing unit mounted on a side of the body with a different angle, and a pulled portion mounted on the other side of the body, when disassociating the absorbing member from the surface of the central processing unit, the pulled portion being pulled to press the elastic member, the disassociating flake rotating around the fixing member in the meanwhile, so the forcing member moving relative to the central processing unit to press the surface of the central processing unit for completely disassociating, then the elastic member moving the disassociating flake back to its original place by elasticity.

11. The radiation apparatus of claim 10, wherein the elastic member, a leaf spring, comprises a pressing end and a forcing end, the neck of the fixing member passing through the elastic member between the pressing end and the forcing end, after the pulled portion being pulled, the pressing end and the pulled portion moving at the same time, the forcing end and the body rotating together, and the forcing end pressing the body for disassociating the absorbing member.

12. The radiation apparatus of claim 11, wherein the elastic member comprises a hole for the neck of the fixing member to pass through.

13. The radiation apparatus of claim 10 further comprises a sleeve moveably mounted to the neck of the fixing member passing through the disassociating flake, and the sleeve and the head of the fixing member clipping the elastic member.

14. The radiation apparatus of claim 13, wherein the absorbing member comprises a screw hole, the neck of the fixing member comprising an outer screw thread, the sleeve comprising an inner screw thread corresponding to the outer screw thread for combining the fixing member and the sleeve.

15. The radiation apparatus of claim 10, wherein the disassociating flake further comprises a hollow for the neck of the fixing member to pass through.

16. The radiation apparatus of claim 10, wherein the fixing member is a screw.

* * * * *